US011049655B2

(12) United States Patent
Nishimura et al.

(10) Patent No.: US 11,049,655 B2
(45) Date of Patent: Jun. 29, 2021

(54) RESIN-MOLDED CAPACITOR AND POWER CONVERSION DEVICE

(71) Applicant: Mitsubishi Electric Corporation, Tokyo (JP)

(72) Inventors: Kengo Nishimura, Tokyo (JP); Satoshi Ishibashi, Tokyo (JP); Hidehito Yoshida, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/254,851

(22) Filed: Jan. 23, 2019

(65) Prior Publication Data

US 2020/0118753 A1    Apr. 16, 2020

(30) Foreign Application Priority Data

Oct. 16, 2018 (JP) .............................. JP2018-194768

(51) Int. Cl.
*H01G 4/224* (2006.01)
*H01G 4/228* (2006.01)
(Continued)

(52) U.S. Cl.
CPC ............. *H01G 4/224* (2013.01); *H01G 4/228* (2013.01); *H01G 4/33* (2013.01); *H01G 4/38* (2013.01);
(Continued)

(58) Field of Classification Search
CPC ............ H01G 4/38; H01G 4/224; H01G 2/10; H01G 2/106; H01G 4/228; H01G 4/33;
(Continued)

(56) References Cited

U.S. PATENT DOCUMENTS

2009/0059467 A1    3/2009  Grimm et al.
2009/0195957 A1    8/2009  Grimm et al.
(Continued)

FOREIGN PATENT DOCUMENTS

JP        3-12424 U      2/1991
JP        11-298184 A    10/1999
(Continued)

OTHER PUBLICATIONS

Reason for Rejection dated Sep. 10, 2019 issued by the Japanese Patent Office in counterpart application No. 2018-194768.
(Continued)

*Primary Examiner* — Arun Ramaswamy
(74) *Attorney, Agent, or Firm* — Sughrue Mion, PLLC; Richard C. Turner

(57) ABSTRACT

The present application provides a resin-molded capacitor such that heat generated by a capacitor element can be efficiently dissipated, and a power conversion device. The resin-molded capacitor includes a first bus bar and a second bus bar joined to a first capacitor electrode and a second capacitor electrode respectively of a capacitor element, an insulating member joined to at least one of the first capacitor electrode and the second capacitor electrode or at least one of the first bus bar and the second bus bar, and an electrically conductive member joined to the insulating member.

14 Claims, 6 Drawing Sheets

(51) Int. Cl.
*H01G 4/33* (2006.01)
*H01G 4/38* (2006.01)
*H01G 4/40* (2006.01)
*H02M 7/217* (2006.01)
*H05K 7/20* (2006.01)
*H02M 7/00* (2006.01)

(52) U.S. Cl.
CPC .............. *H01G 4/40* (2013.01); *H02M 7/003* (2013.01); *H02M 7/217* (2013.01); *H05K 7/209* (2013.01); *H05K 7/20854* (2013.01)

(58) Field of Classification Search
CPC ........ H01G 4/40; H02M 7/217; H02M 7/003; H05K 7/20854
USPC ...... 361/328, 734, 274.1, 306.1, 303, 301.5, 361/301.3
See application file for complete search history.

(56) References Cited

U.S. PATENT DOCUMENTS

| | | | | |
|---|---|---|---|---|
| 2011/0102966 A1* | 5/2011 | Takeoka | ................... | H01G 2/08 361/301.3 |
| 2013/0335881 A1* | 12/2013 | Atsumi | ................... | H01G 11/74 361/303 |
| 2015/0348710 A1* | 12/2015 | Sato | ........................ | H01G 2/04 361/307 |
| 2017/0148570 A1* | 5/2017 | Park | ........................ | H01G 4/224 |
| 2017/0169948 A1 | 6/2017 | Zhang et al. | | |

FOREIGN PATENT DOCUMENTS

| | | |
|---|---|---|
| JP | 2008-541416 A | 11/2008 |
| JP | 2013-191805 A | 9/2013 |
| JP | 5370364 B2 | 12/2013 |
| JP | 2014-135327 A | 7/2014 |
| JP | 2015-149805 A | 8/2015 |

OTHER PUBLICATIONS

Rejection Assessment dated Feb. 12, 2020 from the Japanese Patent Office in Application No. 2018-194768.

Communication dated Mar. 12, 2021, issued by the State Intellectual Property Office of P.R.C. in application No. 201910958205.3.

* cited by examiner

RESIN-MOLDED CAPACITOR AND POWER CONVERSION DEVICE

BACKGROUND OF THE INVENTION

Field of the Invention

The present application relates to a resin-molded capacitor and a power conversion device.

Description of the Background Art

A power conversion device used in a hybrid car or an electric vehicle is configured so as to carry out power conversion between a vehicle-driving rotating electrical machine and a vehicle-mounted battery. For example, when the rotating electrical machine is a three-phase alternating current rotating electrical machine, the power conversion device includes a power conversion circuit formed of a three-phase bridge circuit configured of six semiconductor switching elements. The three-phase bridge circuit is such that a direct current side terminal thereof is connected to an electrode terminal of the vehicle-mounted battery, and an alternating current side terminal is connected to a winding terminal of an armature winding of the rotating electrical machine.

When the rotating electrical machine operates as a motor that drives a vehicle, direct current power from the vehicle-mounted battery is converted into three-phase alternating current power by the power conversion device, and supplied to the rotating electrical machine. Meanwhile, when the rotating electrical machine operates as a generator, as when regenerative braking is carried out, three-phase alternating current power generated by the rotating electrical machine is converted into direct current power by the power conversion device, and supplied to the vehicle-mounted battery. As is commonly known, the power conversion device includes a smoothing capacitor connected between positive and negative direct current terminals of the power conversion circuit. Direct current power from the power conversion circuit is smoothed by the smoothing capacitor, and supplied to the vehicle-mounted battery.

A capacitor with a comparatively large capacity is used as the smoothing capacitor. For example, capacity may be increased by a multiple of capacitor elements being connected in parallel using a bus bar, a resin-molded capacitor configured by the capacitor elements being integrally sealed using resin, and the resin-molded capacitor used as the smoothing capacitor. As the resin-molded capacitor is such that a multiple of capacitor elements are integrally sealed using resin, component durability increases, but a measure for causing heat generated by the capacitor elements to be dissipated is needed.

To date, a resin-molded capacitor having a capacitor element housed in a case, a bus bar that includes a terminal portion for external connection and is fixed to the capacitor element, a resin member packed into the case and sealing the capacitor element and the bus bar excepting the terminal portion of the bus bar, and a heat dissipating member configured of a material having a thermal conductivity higher than a thermal conductivity of the resin member and extending from an interior of the resin member to an exterior of the resin member, has been disclosed as an example of a resin-molded capacitor including a measure for dissipating heat generated by a capacitor element (refer to Patent Document 1).

The existing resin-molded capacitor disclosed in Patent Document 1 is of a structure wherein a heat dissipating member having a thermal conductivity higher than a thermal conductivity of a resin member is sealed in resin, and heat in an interior of a case is efficiently discharged to an exterior of the case by the heat dissipating member being led to the exterior of the case. Also, a portion of the heat dissipating member exposed to the exterior is of a structure that also fulfils a role as a fixing member for fixing the resin-molded capacitor to another member.

Also, a resin-molded capacitor including a capacitor element joined body that includes a capacitor element having an electrode and a bus bar joined to the electrode of the capacitor element, an outer body formed of resin that covers the capacitor element joined body so as to expose a terminal portion of the bus bar, and a support body embedded in the outer body and formed of an insulating material having thermal conductivity, wherein a first terminal portion in contact with the capacitor element joined body and a second terminal portion exposed in the outer body are included in the support body, has been disclosed as another example of a resin-molded capacitor including a measure for dissipating heat generated by a capacitor element (refer to Patent Document 2).

In the resin-molded capacitor disclosed in Patent Document 2, a support body is such that a second terminal portion is exposed to an exterior of an outer body, because of which the second terminal portion functions as a heat dissipating member, and also has a function as a member for positioning the resin-molded capacitor.

Patent Document 1: JP-A-2013-191805
Patent Document 2: Japanese Patent No. 5,370,364

As the existing resin-molded capacitors disclosed in Patent Document 1 and Patent Document 2 are of a structure wherein a capacitor element, a bus bar, and a heat dissipating member or a support body are formed into a module by being insert-molded in a resin, parts such as the capacitor element are sealed with a resin with comparatively low thermal conductivity, because of which there are problems in that heat dissipation of the capacitor element and a bus bar joined to an electrode thereof is not necessarily sufficient, and a problem such as vibration of the capacitor element, and a generation of noise accompanying the vibration, cannot be restricted.

SUMMARY OF THE INVENTION

The present application has been made to resolve the above problem, and an object of the present application is to provide a resin-molded capacitor such that heat generated by a capacitor element can be efficiently dissipated.

Furthermore, an object of the present application is to provide a power conversion device including a smoothing capacitor such that heat generated by a capacitor element can be efficiently dissipated.

A resin-molded capacitor disclosed in the present application is a resin-molded capacitor such that a capacitor main body is sealed with a resin, wherein the capacitor main body includes a capacitor element including a first capacitor electrode and a second capacitor electrode, a first bus bar joined to the first capacitor electrode and connected to an external electrical circuit, a second bus bar joined to the second capacitor electrode and connected to the external electrical circuit, an insulating member joined to at least one of the first capacitor electrode and the second capacitor electrode or at least one of the first bus bar and the second bus bar, and an electrically conductive member joined to the insulating member and fixed to an external structure.

Also, a resin-molded capacitor disclosed in the present application is a resin-molded capacitor such that a capacitor main body is sealed with a resin, wherein the capacitor main body includes a capacitor element including a first capacitor electrode and a second capacitor electrode, a first bus bar joined to the first capacitor electrode and connected to an external electrical circuit, a second bus bar joined to the second capacitor electrode and connected to the external electrical circuit, an insulating member joined to a winding face of the capacitor element, and an electrically conductive member joined to the insulating member and fixed to an external structure.

Furthermore, a resin-molded capacitor disclosed in the present application is a resin-molded capacitor such that a capacitor main body is sealed with a resin, wherein the capacitor main body includes a capacitor element including a first capacitor electrode and a second capacitor electrode, a first bus bar joined to the first capacitor electrode and connected to an external electrical circuit, a second bus bar joined to the second capacitor electrode and connected to the external electrical circuit, a first insulating member joined to the first capacitor electrode or the first bus bar, a second insulating member joined to the second capacitor electrode or the second bus bar, a third insulating member joined to a winding face of the capacitor element, a first electrically conductive member joined to the first insulating member and the second insulating member and fixed to an external structure, and a second electrically conductive member joined to the third insulating member and fixed to the external structure.

Also, a power conversion device disclosed in the present application is a power conversion device including a power conversion circuit that converts power between an alternating current electrical apparatus and a direct current power supply, wherein a smoothing capacitor is connected between direct current side terminals of the power conversion circuit, and the smoothing capacitor is configured of any one of the previously described resin-molded capacitors.

According to the resin-molded capacitor disclosed in the present application, the capacitor main body includes a capacitor element including a first capacitor electrode and a second capacitor electrode, a first bus bar joined to the first capacitor electrode and connected to an external electrical circuit, a second bus bar joined to the second capacitor electrode and connected to the external electrical circuit, an insulating member joined to at least one of the first capacitor electrode and the second capacitor electrode or at least one of the first bus bar and the second bus bar, and an electrically conductive member joined to the insulating member and fixed to an external structure, because of which a resin-molded capacitor such that heat generated by a capacitor element can be efficiently dissipated can be obtained. Furthermore, when the insulating member is configured of an insulating member having a permittivity higher than a permittivity of an insulating film acting as a component of the capacitor element, common mode noise can be restricted.

Also, according to the resin-molded capacitor disclosed in the present application, the capacitor main body includes a capacitor element including a first capacitor electrode and a second capacitor electrode, a first bus bar joined to the first capacitor electrode and connected to an external electrical circuit, a second bus bar joined to the second capacitor electrode and connected to the external electrical circuit, an insulating member joined to a winding face of the capacitor element, and an electrically conductive member joined to the insulating member and fixed to an external structure, because of which a resin-molded capacitor such that heat generated by a capacitor element can be efficiently dissipated can be obtained. Furthermore, when the insulating member is configured of an insulating member having a modulus of elasticity higher than a modulus of elasticity of the electrically conductive member, mechanical vibration can be restricted.

Furthermore, according to the resin-molded capacitor disclosed in the present application, the capacitor main body includes a capacitor element including a first capacitor electrode and a second capacitor electrode, a first bus bar joined to the first capacitor electrode and connected to an external electrical circuit, a second bus bar joined to the second capacitor electrode and connected to the external electrical circuit, a first insulating member joined to the first capacitor electrode or the first bus bar, a second insulating member joined to the second capacitor electrode or the second bus bar, a third insulating member joined to a winding face of the capacitor element, a first electrically conductive member joined to the first insulating member and the second insulating member and fixed to an external structure, and a second electrically conductive member joined to the third insulating member and fixed to the external structure, because of which a resin-molded capacitor such that heat generated by a capacitor element can be efficiently dissipated can be obtained. Furthermore, when the first insulating member and the second insulating member are configured of an insulating member having a permittivity higher than a permittivity of an insulating film acting as a component of the capacitor element, common mode noise can be restricted, and when the third insulating member is configured of an insulating member having a modulus of elasticity higher than a modulus of elasticity of the second electrically conductive member, mechanical vibration can be restricted.

Also, according to the power conversion device disclosed in the present application, a smoothing capacitor connected between direct current side terminals of a power conversion circuit is configured of any one of the previously described resin-molded capacitors, because of which the smoothing capacitor can be efficiently cooled. Furthermore, common mode noise can be restricted, or mechanical vibration caused by the smoothing capacitor can be restricted.

The foregoing and other object, features, aspects, and advantages of the present invention will become more apparent from the following detailed description of the present invention when taken in conjunction with the accompanying drawings.

DETAILED DESCRIPTION OF THE INVENTION

Figure 1:
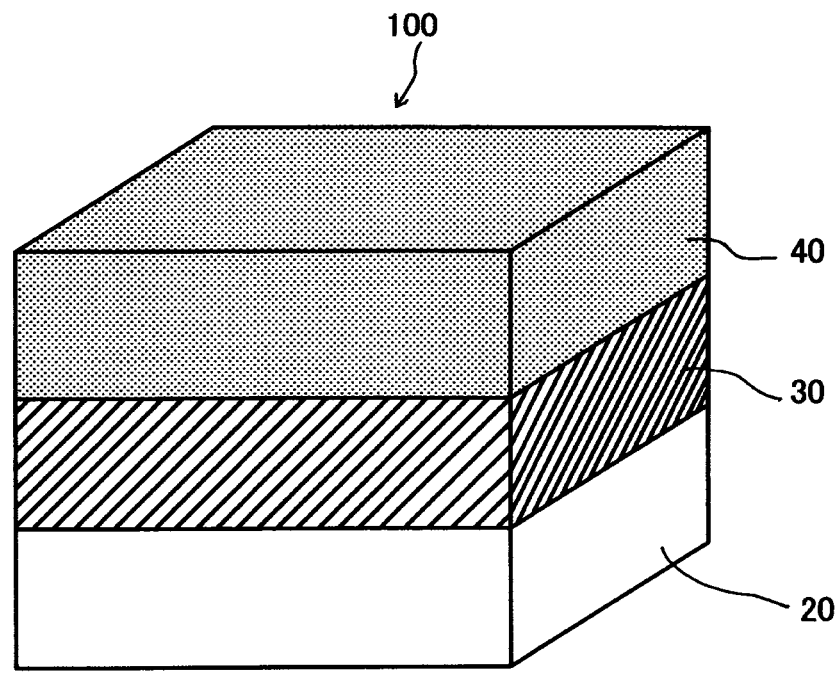
FIG. 1 is a schematic view showing a basic configuration of a resin-molded capacitor of the present application.

FIG. 1 is a schematic view showing a basic configuration of a resin-molded capacitor of the present application. As shown in FIG. 1, a resin-molded capacitor 100 of the present application includes a three-layer structure formed of a heat generating body 20, an insulating member 30, and a heat dissipating member 40 acting as an electrically conductive member. That is, the resin-molded capacitor 100 includes a structure wherein the insulating member 30 is inserted between the heat generating body 20 and the heat dissipating member 40. Herein, the heat generating body 20 corresponds to a capacitor element to be described hereafter, or to a combination of a capacitor element and a bus bar to be described hereafter. The insulating member 30 is configured of an insulating member having a comparatively high permittivity, or an insulating member having a comparatively high modulus of elasticity, as will be described hereafter.

First Embodiment

Figure 2:
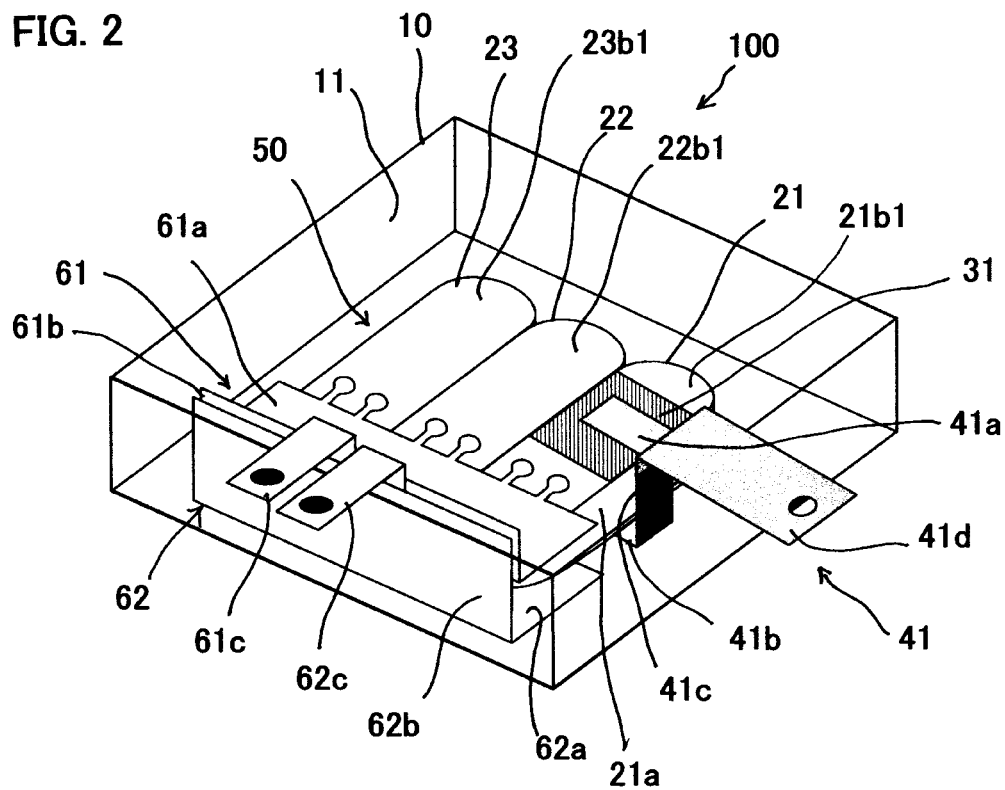
FIG. 2 is an illustration of a resin-molded capacitor according to a first embodiment.
Figure 3:
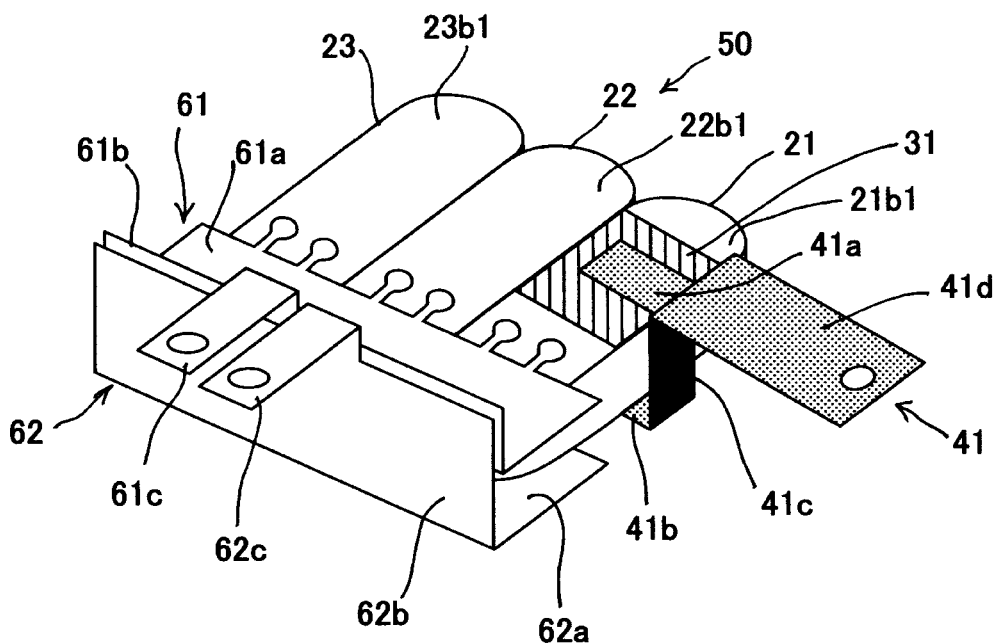
FIG. 3 is an illustration showing a configuration of a capacitor main body of the resin-molded capacitor according to the first embodiment.
Figure 4:
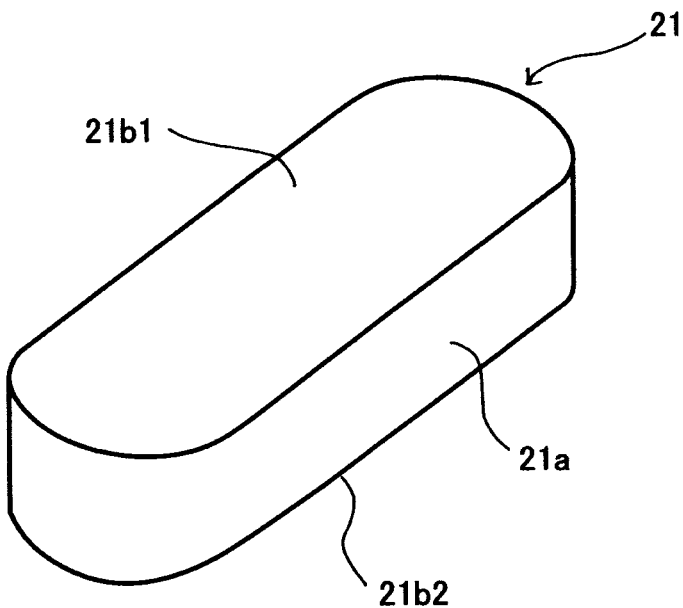
FIG. 4 is a schematic view showing a configuration of a capacitor element used in the resin-molded capacitor according to the first embodiment.
Figure 5:
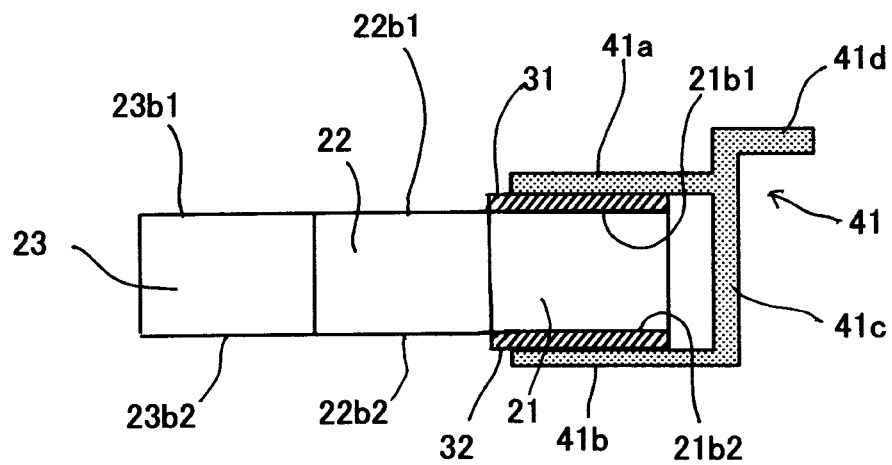
FIG. 5 is a schematic sectional view of the resin-molded capacitor according to the first embodiment.

Next, a resin-molded capacitor according to a first embodiment will be described. FIG. 2 is an illustration of the resin-molded capacitor according to the first embodiment, FIG. 3 is an illustration showing a configuration of a capacitor main body of the resin-molded capacitor according to the first embodiment, FIG. 4 is a schematic view showing a configuration of a capacitor element used in the resin-molded capacitor according to the first embodiment, and FIG. 5 is a schematic sectional view of the resin-molded capacitor according to the first embodiment. In FIGS. 2 and 3, the resin-molded capacitor 100, which is formed into a module, includes a case 10 configured of an insulating member such as a resin, a molding resin 11 formed of, for example, an epoxy resin packed into an interior of the case 10, and a capacitor main body 50 insert molded in the molding resin 11.

The capacitor main body 50 includes a first capacitor element 21, a second capacitor element 22, and a third capacitor element 23. Each of the first capacitor element 21, the second capacitor element 22, and the third capacitor element 23 is configured of a film capacitor. The capacitor element shown in FIG. 4 is the first capacitor element 21, shown as an example.

As shown in FIG. 4, the first capacitor element 21 is configured of a film capacitor wherein a dielectric film of polypropylene or the like and a metal foil are stacked and wound into a flat cylindrical form. The first capacitor element 21 includes a first capacitor electrode 21b1 configured of a metallicon surface formed by spraying molten metal on one end face perpendicular to a winding face 21a, and includes a second capacitor electrode 21b2 configured of a metallicon surface formed by spraying molten metal on another end face perpendicular to the winding face 21a. The second capacitor element 22 and the third capacitor element 23 are of the same configuration as the first capacitor element 21 shown in FIG. 4.

As shown in FIGS. 2, 3, and 5, the first capacitor element 21 and the second capacitor element 22 are placed in parallel so that winding faces of each come into contact. Furthermore, the second capacitor element 22 and the third capacitor element 23 are placed in parallel so that winding faces of each come into contact. Further, the first capacitor electrode 21b1 of the first capacitor element 21, a first capacitor electrode 22b1 of the second capacitor element 22, and a first capacitor electrode 23b1 of the third capacitor element 23 are disposed aligned so as to be substantially of the same height, and the second capacitor electrode 21b2 of the first capacitor element 21, a second capacitor electrode 22b2 of the second capacitor element 22, and a second capacitor electrode 23b2 of the third capacitor element 23 are disposed aligned so as to be substantially of the same height.

A first bus bar 61 includes a first region 61a, and a second region 61b bent at a predetermined angle (for example, 90 degrees) with respect to the first region 61a. The first region 61a of the first bus bar 61 is joined to the first capacitor electrode 21b1 of the first capacitor element 21, the first capacitor electrode 22b1 of the second capacitor element 22, and the first capacitor electrode 23b1 of the third capacitor element 23.

A second bus bar 62 includes a first region 62a, and a second region 62b bent at a predetermined angle (for example, 90 degrees) with respect to the first region 62a. The first region 62a of the second bus bar 62 is joined to the second capacitor electrode 21b2 of the first capacitor element 21, the second capacitor electrode 22b2 of the second capacitor element 22, and the second capacitor electrode 23b2 of the third capacitor element 23.

The first capacitor element 21, the second capacitor element 22, and the third capacitor element 23 are electrically connected in parallel by the first bus bar 61 and the second bus bar 62 configured as previously described.

A first electrode terminal 61c is provided on an end edge of the second region 61b of the first bus bar 61, and is bent at a predetermined angle (for example, 90 degrees) to a non-capacitor element side with respect to the second region 61b. The first region 61a of the first bus bar 61, the second region 61b of the first bus bar 61, and the first electrode terminal 61c are, for example, integrally formed of one metal plate.

A second electrode terminal 62c is provided on an end edge of the second region 62b of the second bus bar 62, and is bent at a predetermined angle (for example, 90 degrees) to the non-capacitor element side with respect to the second region 62b. The first region 62a of the second bus bar 62, the second region 62b of the second bus bar 62, and the second electrode terminal 62c are, for example, integrally formed of one metal plate. The first electrode terminal 61c and the second electrode terminal 62c are each used for connection with an external circuit.

A first insulating member 31 configured of a material with a comparatively high permittivity, to be described hereafter, is joined to a surface of the first capacitor electrode 21b1 of the first capacitor element 21, as shown in FIGS. 2, 3, and 5. In the same way, a second insulating member 32 formed of a material with a high permittivity, to be described hereafter, is joined to a surface of the second capacitor electrode 21b2 of the first capacitor element 21.

The first insulating member 31 may be joined to a surface of the first region 61a of the first bus bar 61 joined to the first capacitor electrode 21b1 of the first capacitor element 21. In this case, the first insulating member 31 is interposed between the first region 61a of the first bus bar 61 and a first region 41a of an electrically conductive member 41, to be described hereafter, electrically isolating the first bus bar 61 and the electrically conductive member 41.

The first insulating member 31 and the second insulating member 32 are configured of, for example, a sheet-form material containing a filler with a relative permittivity of "20" or more, and have a thickness of approximately 2 µm. As is commonly known, polypropylene acting as an insulating film commonly used as a film capacitor has a relative permittivity of "2", and a thickness in the region of several micrometers. Consequently, the first insulating member 31 and the second insulating member 32 are such that the relative permittivity is high, and the thickness is small, in comparison with those of the previously described polypropylene. The material, the thickness, and the capacitance value of the first insulating member 31 and the second insulating member 32 are not limited to those previously described.

The first insulating member 31 and the second insulating member 32, which are configured of an insulating member having a permittivity higher than the permittivity of the insulating film of a capacitor element configured of a film capacitor, are such that although an area functioning as a capacitor is small compared with that of a capacitor element configuring a main capacitor, a function as a Y-capacitor that allows a weak current forming noise to pass through is sufficiently provided.

As shown in FIGS. 2, 3, and 5, the electrically conductive member 41 is configured of the first region 41a, a second region 41b, a third region 41c joined to the first region 41a and the second region 41b, and a fastening terminal 41d joined to the third region 41c. The first region 41a is brought into contact with a surface of the first insulating member 31, and the second region 41b is brought into contact with a surface of the second insulating member 32. The first region 41a, the second region 41b, the third region 41c, and the fastening terminal 41d are integrally formed of the same metal member, but may also be formed of separate metal members and joined to each other.

The fastening terminal 41d of the electrically conductive member 41 is connected to a frame of an external circuit, such as a power conversion circuit, to which the resin-molded capacitor 100 is connected, or to a cooler, or the like, having a potential equal to a potential of the frame. As a result of this, a potential of the electrically conductive member 41 is equal to a ground potential, which is the potential of the frame.

Figure 6:
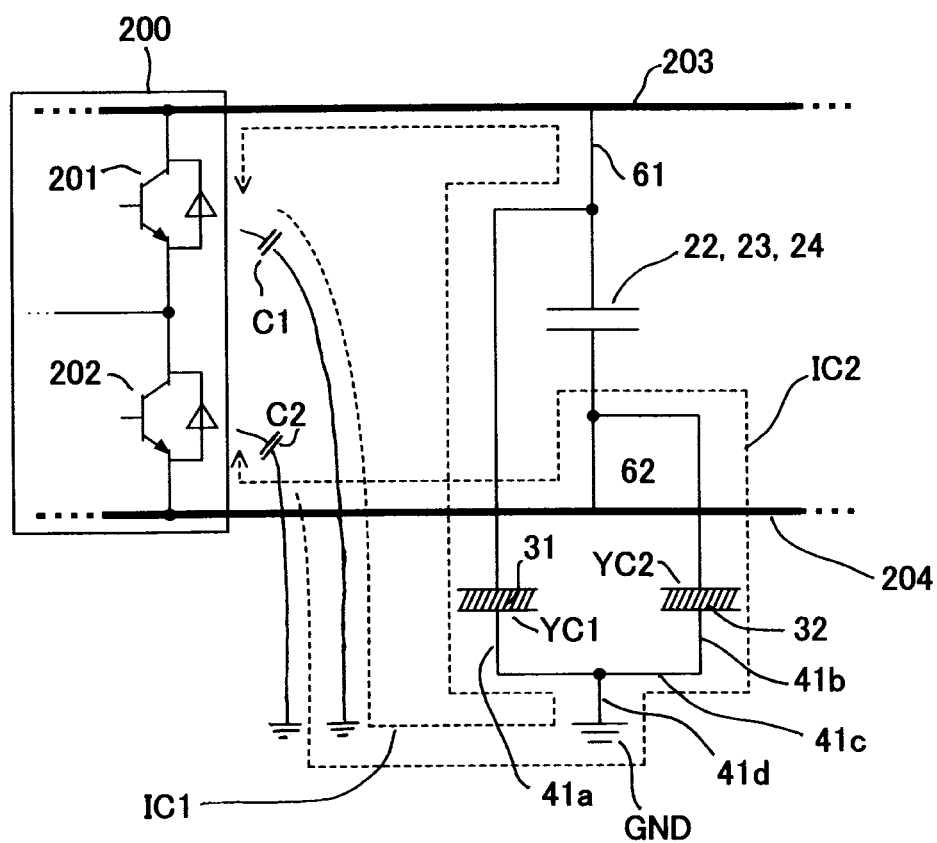
FIG. 6 is a circuit diagram for illustrating the resin-molded capacitor according to the first embodiment.

FIG. 6 is a circuit diagram for illustrating the resin-molded capacitor according to the first embodiment, and shows the resin-molded capacitor 100 according to the first embodiment when used as a smoothing capacitor of a power conversion device. As shown in FIG. 6, a power conversion circuit 200 includes, for example, a multiple of switching elements 201 and 202 configuring a three-phase bridge circuit. The resin-molded capacitor 100 according to the first embodiment is connected between a positive electrode side terminal 203 and a negative electrode side terminal 204 of the power conversion circuit 200. Herein, the first bus bar 61 of the resin-molded capacitor 100 is connected to the positive electrode side terminal 203 of the power conversion circuit 200 via the first electrode terminal 61c, and the second bus bar 62 is connected to the negative electrode side terminal 204 of the power conversion circuit 200 via the second electrode terminal 62c.

The first insulating member 31 inserted between the first capacitor electrode 21b1 of the first capacitor element 21 and the first region 41a forms a first Y-capacitor YC1, and the second insulating member 32 inserted between the second capacitor electrode 21b2 of the first capacitor element 21 and the second region 41b forms a second Y-capacitor YC2.

The first Y-capacitor YC1 can restrict a common mode noise current IC1 that flows from the power conversion circuit 200 into a stray capacitance C1, a ground potential portion GND of a frame of the power conversion circuit, or the like, and the positive electrode side terminal of the power conversion circuit 200, and the second Y-capacitor YC2 can restrict a common mode noise current IC2 that flows from the power conversion circuit 200 into a stray capacitance C2, the ground potential portion GND, and the negative electrode side terminal of the power conversion circuit 200. As a result of this, common mode noise originating from a switching operation of the switching elements 201 and 202 of the power conversion circuit 200, and the like, can be reduced.

The first region 41a of the electrically conductive member 41 is joined to the first capacitor electrode 21b1 of the first capacitor element 21 across the first insulating member 31, and the second region 41b of the electrically conductive member 41 is joined to the second capacitor electrode 21b2 of the first capacitor element 21 across the second insulating member 32. Consequently, heat generated by the first capacitor element 21, the second capacitor element 22, and the third capacitor element 23 is transmitted from the first capacitor electrodes 21b1, 22b1, and 23b1 of the respective capacitor elements via the first insulating member 31 to the first region 41a, and transmitted from the second capacitor electrodes 21b2, 22b2, and 23b2 of the respective capacitor elements via the second insulating member 32 to the second region 41b.

Heat from each capacitor element transmitted to the first region 41a and the second region 41b is radiated from the fastening terminal 41d of the electrically conductive member 41 to a structure such as the frame of the power conversion device, whereby each capacitor element is cooled.

As heretofore described, the resin-molded capacitor according to the first embodiment is configured of a multiple of capacitor elements, a bus bar that electrically connects electrodes of each of the multiple of capacitor elements, an electrically conductive member for dissipating heat of the capacitor element, an insulating member disposed between the capacitor element and the electrically conductive member, a case that houses these components, and a molding resin packed into the case. A first electrode terminal and a second electrode terminal for connecting the resin-molded capacitor to an external circuit, and a fastening terminal for fixing the resin-molded capacitor to a frame or the like of a power conversion circuit, are configured so as to be exposed to an exterior from the molding resin. Heat generated by the capacitor element is radiated to a structure such as the frame of the power conversion circuit via the fastening terminal, whereby the resin-molded capacitor is cooled.

The insulating member has a permittivity higher than a permittivity of an insulating film configuring the capacitor element, is disposed between the capacitor electrode of the capacitor element or the bus bar joined to the capacitor electrode and the heat dissipating electrically conductive member, and conducts electrical insulation between the capacitor electrode or the bus bar joined to the capacitor electrode and the heat dissipating electrically conductive member. As the insulating member is configured of a material having a permittivity higher than the permittivity of the insulating film configuring the capacitor element, a capacitance component is generated between the capacitor electrode of the capacitor element or the bus bar joined to the capacitor electrode and the electrically conductive member, and the capacitance component functions as the Y-capacitor, and restricts common mode noise.

Second Embodiment

Figure 7:
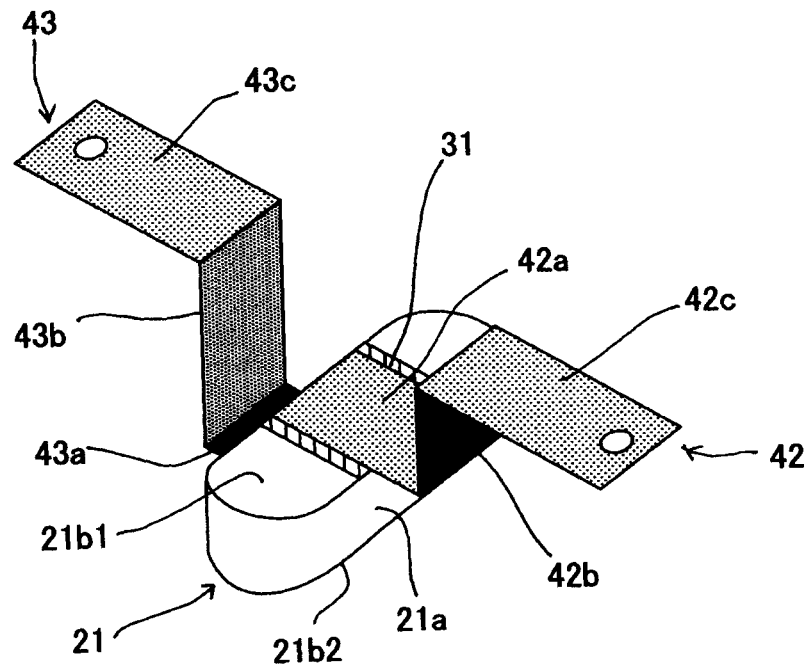
FIG. 7 is an illustration of a resin-molded capacitor according to a second embodiment.

Next, a resin-molded capacitor according to a second embodiment will be described. FIG. 7 is an illustration of the resin-molded capacitor according to the second embodiment, and schematically shows only a portion differing from the resin-molded capacitor according to the first embodiment. In FIG. 7, the first insulating member 31 is joined to a surface of the first capacitor electrode 21b1 of the first capacitor element 21. A second insulating member (not shown) is joined to a surface of the second capacitor electrode 21b2 of the first capacitor element 21.

A first electrically conductive member 42 includes a first region 42a joined to a surface of the first insulating member 31, a second region 42b standing bent at a predetermined angle (for example, 90 degrees) from the first region 42a, and a first fastening terminal 42c bent at a predetermined angle (for example, 90 degrees) to a non-capacitor element side from the second region 42b. The first electrically conductive member 42 is configured of, for example, one metal plate.

A second electrically conductive member 43 includes a first region 43a joined to a surface of the second insulating member, a second region 43b standing bent at a predetermined angle (for example, 90 degrees) from the first region 43a, and a second fastening terminal 43c bent at a predetermined angle (for example, 90 degrees) to a non-capacitor element side from the second region 43b. The second electrically conductive member 43 is configured of, for example, one metal plate.

The first fastening terminal 42c is connected to a frame of an external circuit, such as a power conversion circuit, to which the resin-molded capacitor is connected, or to a cooler, or the like, having a potential equal to a potential of the frame. As a result of this, a potential of the first electrically conductive member 42 is equal to the ground potential, which is the potential of the frame.

In FIG. 7, only the first capacitor element 21 is shown, but three capacitor elements may be placed in parallel, in the same way as in the first embodiment, or another multiple of capacitor elements may be placed in parallel. When a multiple of capacitor elements are placed in parallel, for example, the first electrically conductive member 42 may be disposed on the first capacitor electrode 21b1 of the first capacitor element 21 across the first insulating member 31, and the second electrically conductive member 43 may be disposed across the second insulating member 32 on the second capacitor electrode of a capacitor element other than the first capacitor element 21. Other configurations and effects are the same as those of the resin-molded capacitor according to the first embodiment.

As heretofore described, the resin-molded capacitor according to the second embodiment is configured of a capacitor element, a bus bar that electrically connects electrodes of the capacitor element, a first electrically conductive member and a second electrically conductive member for dissipating heat of the capacitor element, a first insulating member and a second insulating member, disposed between the capacitor element and the electrically conductive member and having a permittivity higher than a permittivity of an insulating film configuring the capacitor element, a case that houses these components, and a molding resin packed into the case. A first electrode terminal and a second electrode terminal for connecting the resin-molded capacitor to an external circuit, and a first fastening terminal and a second fastening terminal for fixing the resin-molded capacitor to a frame or the like of a power conversion circuit, are configured so as to be exposed to an exterior from the molding resin. Heat generated by the capacitor element is radiated to a structure such as the frame of the power conversion circuit via the fastening terminal, whereby the resin-molded capacitor is cooled.

The first insulating member is disposed between the first capacitor electrode of the capacitor element or the first bus bar joined to the first capacitor electrode and the heat dissipating first electrically conductive member, and conducts electrical insulation between the first capacitor electrode or the first bus bar joined to the first capacitor electrode and the heat dissipating first electrically conductive member. The second insulating member is disposed between the second capacitor electrode of the capacitor element and the heat dissipating second electrically conductive member, and conducts electrical insulation between the second capacitor electrode and the heat dissipating second electrically conductive member.

As the first insulating member and the second insulating member are each configured of a material having a permittivity higher than the permittivity of the insulating film configuring the capacitor element, a capacitance component is generated between the first capacitor electrode and the second capacitance electrode of the capacitor element and the first electrically conductive member and the second electrically conductive member. The capacitance component functions as the Y-capacitor, and restricts common mode noise.

Third Embodiment

Figure 8:
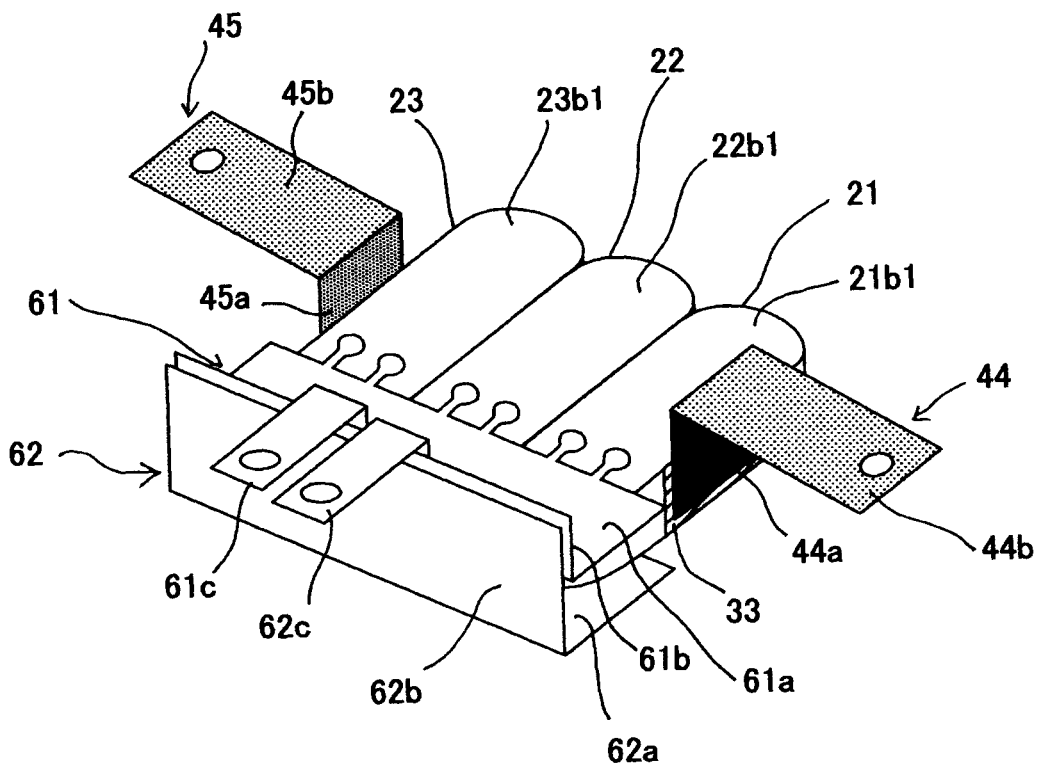
FIG. 8 is an illustration showing a configuration of a capacitor main body of a resin-molded capacitor according to a third embodiment.

Next, a resin-molded capacitor according to a third embodiment will be described. FIG. 8 is an illustration showing a configuration of a capacitor main body of the resin-molded capacitor according to the third embodiment. In FIG. 8, a first insulating member 33 is configured of a material having a modulus of elasticity higher than a modulus of elasticity of a first electrically conductive member 44 to be described hereafter, and having an insulating property, and is joined to the winding face 21a of the first capacitor element 21. In the same way, a second insulating member (not shown) is configured of a material having a modulus of elasticity higher than a modulus of elasticity of a second electrically conductive member 45 to be described hereafter, and having an insulating property, and is joined to a winding face of the third capacitor element 23.

The first electrically conductive member 44, which is configured of metal, includes a first region 44a joined to a surface of the first insulating member 33, and a first fastening terminal 44b bent at a predetermined angle (for example, 90 degrees) to a non-capacitor element side from the first region 44a. The second electrically conductive member 45, which is configured of metal, includes a first region 45a joined to a surface of the second insulating member, and a second fastening terminal 45b bent at a predetermined angle (for example, 90 degrees) to a non-capacitor element side from the first region 45a. The number of electrically conductive members is not limited to two.

The first fastening terminal 44b of the first electrically conductive member 44 and the second fastening terminal 45b of the second electrically conductive member 45 are each fastened to a frame of an external circuit, such as a power conversion circuit, to which the resin-molded capacitor is connected, or to a cooler, or the like, having a potential equal to a potential of the frame, whereby potentials of the first electrically conductive member 44 and the second electrically conductive member 45 are equal to the potential of the frame, that is, the ground potential. Other configurations are the same as in the first embodiment.

The resin-molded capacitor according to the third embodiment is configured of a capacitor element, a bus bar that electrically connects electrodes of the capacitor element, an electrically conductive member for dissipating heat of the capacitor element, an insulating member, disposed between the capacitor element and the electrically conductive member, formed of a material having a modulus of elasticity higher than a modulus of elasticity of the electrically conductive member and having an insulating property, a case that houses these components, and a molding resin packed into the case. A first electrode terminal and a second electrode terminal for connecting the resin-molded capacitor to an external circuit, and a first fastening terminal and a second fastening terminal for fixing the resin-molded capacitor to a frame or the like of a power conversion circuit, are configured so as to be exposed to an exterior from the molding resin.

The resin-molded capacitor according to the third embodiment is such that, by an insulating member having a modulus of elasticity higher than a modulus of elasticity of an electrically conductive member being disposed between a capacitor element and the electrically conductive member, physical vibration occurring in the capacitor element is restricted, the physical vibration can be prevented from being propagated to a frame and a cooler through the electrically conductive member, and heat generated by the capacitor element can be caused to radiate to a structure such as a frame of a power conversion circuit via a fastening terminal of the electrically conductive member.

Fourth Embodiment

Figure 9:
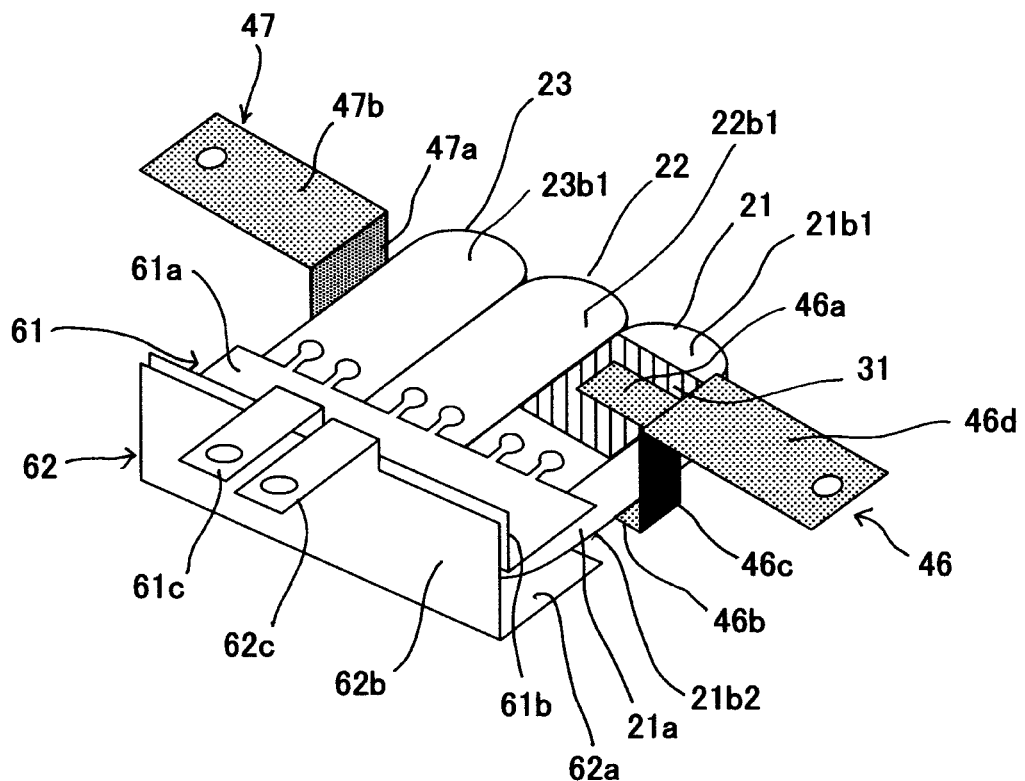
FIG. 9 is an illustration showing a configuration of a capacitor main body of a resin-molded capacitor according to a fourth embodiment.
Figure 10:
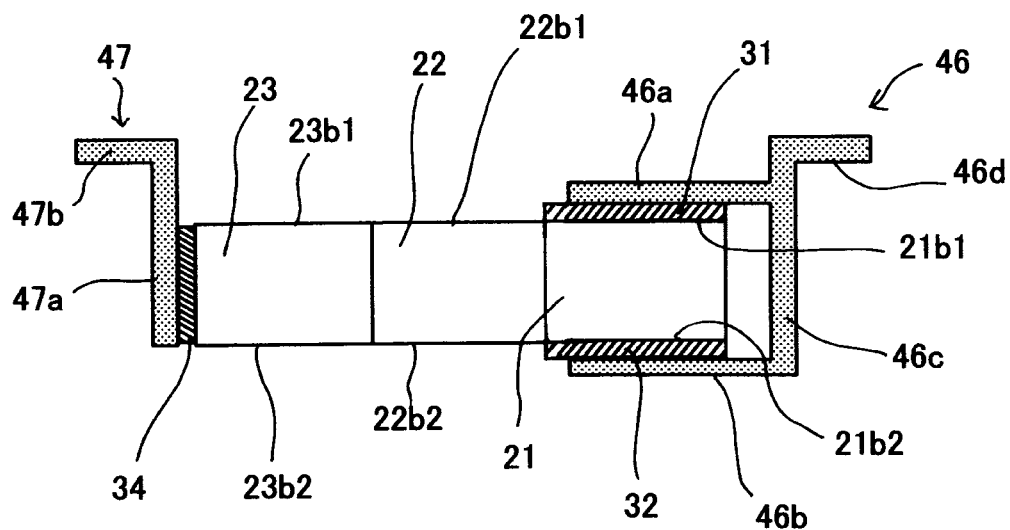
FIG. 10 is a schematic sectional view of the resin-molded capacitor according to the fourth embodiment.

Next, a resin-molded capacitor according to a fourth embodiment will be described. FIG. 9 is an illustration showing a configuration of a capacitor main body of the resin-molded capacitor according to the fourth embodiment, and FIG. 10 is a schematic sectional view of the resin-molded capacitor according to the fourth embodiment. In FIGS. 9 and 10, the first insulating member 31, which is configured of a material having a permittivity higher than a permittivity of an insulating film configuring a capacitor element, is joined to the surface of the first capacitor electrode 21b1 of the first capacitor element 21. In the same way, the second insulating member 32, which is configured of a material having a permittivity higher than the permittivity of an insulating film configuring a capacitor element, is joined to the surface of the second capacitor electrode 21b2 of the first capacitor element 21.

The first insulating member 31 may be joined to the surface of the first region 61a of the first bus bar 61 joined to the first capacitor electrode 21b1 of the first capacitor element 21. In this case, the first insulating member 31 is interposed between the first region 61a of the first bus bar 61 and a first region 46a of a first electrically conductive member 46, to be described hereafter, electrically isolating the first bus bar 61 and the first electrically conductive member 46.

The first electrically conductive member 46 is configured of the first region 46a, a second region 46b, a third region 46c joined to the first region 46a and the second region 46b, and a first fastening terminal 46d provided on the third region 46c. The first region 46a is brought into contact with a surface of the first insulating member 31, and the second region 46b is brought into contact with a surface of the second insulating member 32. The first region 46a, the second region 46b, the third region 46c, and the first fastening terminal 46d may be integrally formed of the same metal member, or at least one may be formed of a separate metal member, and the metal members combined.

A third insulating member 34 is configured of a material having a modulus of elasticity higher than a modulus of elasticity of a second electrically conductive member 47, and having an insulating property, and is joined to a winding face of the third capacitor element 23. The second electrically conductive member 47 includes a first region 47a joined to a surface of the third insulating member 34, and a second fastening terminal 47b bent at a predetermined angle (for example, 90 degrees) in a direction of a non-capacitor element side from the first region 47a.

The first fastening terminal 46d of the first electrically conductive member 46 and the second fastening terminal 47b of the second electrically conductive member 47 are connected to a frame of an external circuit, such as a power conversion circuit, to which the resin-molded capacitor is connected, or to a cooler, or the like, having a potential equal to a potential of the frame. As a result of this, potentials of the first electrically conductive member 46 and the second electrically conductive member 47 are equal to the potential of the frame, which is at the ground potential.

As the first insulating member 31 and the second insulating member 32 are each configured of a material having a permittivity higher than the permittivity of the insulating film configuring the first capacitor element 21, a capacitance component is generated between the first capacitor electrode 21b1 and the second capacitance electrode 21b2 of the first capacitor element 21 and the first electrically conductive member 46 and the second electrically conductive member 47. The capacitance component functions as the Y-capacitor, and restricts common mode noise.

Also, by an insulating member having a modulus of elasticity higher than a modulus of elasticity of the second electrically conductive member being disposed between the third capacitor element and the second electrically conductive member, physical vibration occurring in the capacitor element is restricted, and the physical vibration can be prevented from being propagated to a frame and a cooler through the electrically conductive member. Furthermore, heat generated by the capacitor element is radiated to a structure such as a frame of a power conversion circuit via the first fastening terminal and the second fastening terminal, whereby the resin-molded capacitor is effectively cooled.

Fifth Embodiment

Figure 11:
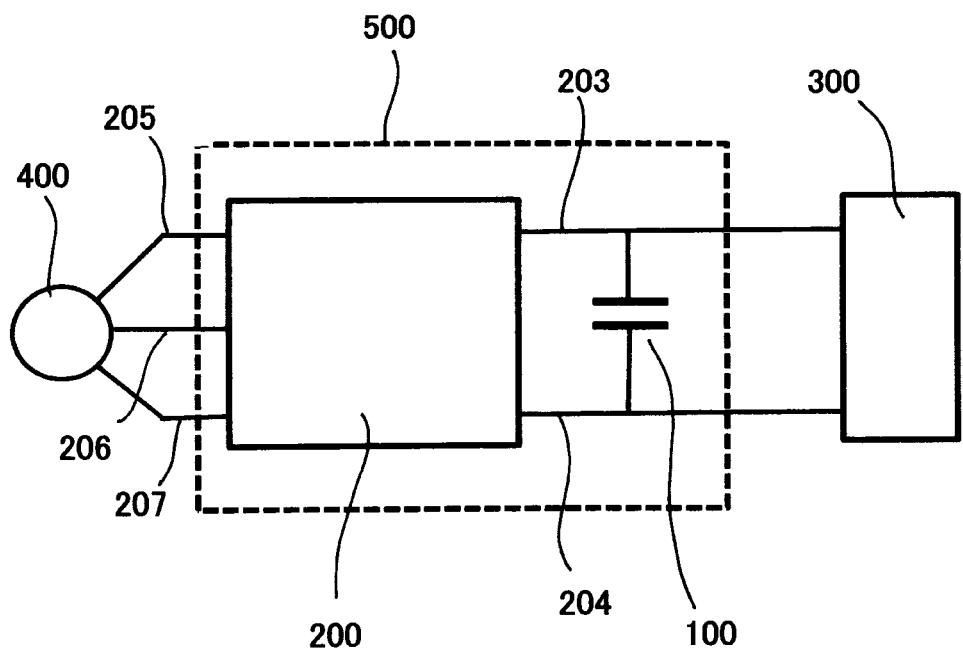
FIG. 11 is a block diagram showing a power conversion device according to a fifth embodiment.

Next, a power conversion device according to a fifth embodiment will be described. FIG. 11 is a block diagram showing the power conversion device according to the fifth embodiment. In FIG. 11, a power conversion device 500 according to the fifth embodiment includes the power conversion circuit 200, and the resin-molded capacitor 100 connected between the positive electrode side terminal 203 and the negative electrode side terminal 204 of the power conversion circuit 200. The positive electrode side terminal 203 and the negative electrode side terminal 204 of the power conversion circuit 200 are connected to, for example, direct current power supply output terminals. The power conversion circuit 200 is, for example, a three-phase power conversion circuit, and includes a three-phase bridge circuit formed of a multiple of switching elements. Alternating current side terminals 205, 206, and 207 of the power conversion circuit 200 are connected to input terminals of an alternating current rotating electrical machine 400. The power conversion device 500 carries out power conversion between the direct current power supply 300 and the alternating current rotating electrical machine 400.

The resin-molded capacitor 100 is configured of the resin-molded capacitor of any of the first embodiment to the fourth embodiment, and operates as a smoothing capacitor in the power conversion device 500.

As the power conversion device according to the fifth embodiment includes a smoothing capacitor configured of the resin-molded capacitor of any of the first embodiment to the fourth embodiment, the smoothing capacitor can be efficiently cooled, and common mode noise can be restricted, or mechanical vibration caused by the smoothing capacitor can be restricted.

Although the present application is described above in terms of various exemplifying embodiments and implementations, it should be understood that the various features, aspects, and functionalities described in one or more of the individual embodiments are not limited in their applicability to the particular embodiment with which they are described, but instead can be applied, alone or in various conditions, to one or more of the embodiments. It is therefore understood that numerous modifications that have not been exemplified can be devised without departing from the scope of the present application. For example, at least one of the constituent components may be modified, added, or eliminated. At least one of the constituent components mentioned in at least one of the preferred embodiments may be selected, and combined with the constituent components mentioned in another preferred embodiment.

What is claimed is:

1. A resin-molded capacitor such that a capacitor main body is sealed with a resin,
    the capacitor main body including
    a capacitor element including
    a first capacitor electrode and a second capacitor electrode;
    a first bus bar joined to the first capacitor electrode and connected to an external electrical circuit,
    a second bus bar joined to the second capacitor electrode and connected to the external electrical circuit,
    an insulating member joined to at least one of the first capacitor electrode and the second capacitor electrode or at least one of the first bus bar and the second bus bar, and
    an electrically conductive member extending through the resin, joined to the insulating member, and fixed to an external structure, the electrically conductive member being electrically isolated from the first bus bar and the second bus bar, wherein the insulating member is configured of:
    a first insulating member joined to the first capacitor electrode of the capacitor element or the first bus bar, and
    a second insulating member joined to the second capacitor electrode of the capacitor element or the second bus bar, and
    wherein the electrically conductive member is configured of a first electrically conductive member joined to the first insulating member, and a second electrically conductive member joined to the second insulating member.

2. The resin-molded capacitor according to claim 1, wherein the insulating member is has a permittivity higher than a permittivity of an insulating film acting as a component of the capacitor element.

3. The resin-molded capacitor according to claim 1, wherein
    the electrically conductive member includes a first region joined to the first insulating member and a second region joined to the second insulating member.

4. The resin-molded capacitor according to claim 1, wherein
    the first bus bar includes a first electrode terminal connected to the external electrical circuit,
    the second bus bar includes a second electrode terminal connected to the external electrical circuit,
    the electrically conductive member includes a fastening terminal fixed to the external structure, and
    the first electrode terminal, the second electrode terminal, and the fastening terminal are exposed to an exterior from the resin.

5. A power conversion device comprising a power conversion circuit that converts power between an alternating current electrical apparatus and a direct current power supply, wherein
    a smoothing capacitor is connected between direct current side terminals of the power conversion circuit, and
    the smoothing capacitor is configured of the resin-molded capacitor according to claim 1.

6. A power conversion device comprising a power conversion circuit that converts power between an alternating current electrical apparatus and a direct current power supply, wherein
    a smoothing capacitor is connected between direct current side terminals of the power conversion circuit, and
    the smoothing capacitor is configured of the resin-molded capacitor according to claim 2.

7. A resin-molded capacitor such that a capacitor main body is sealed with a resin,
    the capacitor main body including
    a capacitor element including a first capacitor electrode and a second capacitor electrode,
    a first bus bar joined to the first capacitor electrode and connected to an external electrical circuit,
    a second bus bar joined to the second capacitor electrode and connected to the external electrical circuit,
    an insulating member joined to a winding face of the capacitor element, and
    an electrically conductive member joined to the insulating member and fixed to an external structure, wherein
    the insulating member is configured of an insulating member having a modulus of elasticity higher than a modulus of elasticity of the electrically conductive member.

8. The resin-molded capacitor according to claim 7, wherein
    the insulating member is configured of
    a first insulating member joined to a predetermined winding face of the capacitor element, and a second insulating member joined to a winding face differing from the predetermined winding face of the capacitor element, and the electrically conductive member is configured of a first electrically conductive member joined to the first insulating member, and a second electrically conductive member joined to the second insulating member.

9. A power conversion device comprising a power conversion circuit that converts power between an alternating current electrical apparatus and a direct current power supply, wherein a smoothing capacitor is connected between direct current side terminals of the power conversion circuit, and the smoothing capacitor is configured of the resin-molded capacitor according to claim 7.

10. A resin-molded capacitor such that a capacitor main body is sealed with a resin, the capacitor main body including a capacitor element including a first capacitor electrode and a second capacitor electrode, a first bus bar joined to the first capacitor electrode and connected to an external electrical circuit, a second bus bar joined to the second capacitor electrode and connected to the external electrical circuit, a first insulating member joined to the first capacitor electrode or the first bus bar, a second insulating member joined to the second capacitor electrode or the second bus bar, a third insulating member joined to a winding face of the capacitor element, a first electrically conductive member joined to the first insulating member and the second insulating member and fixed to an external structure, the first electrically conductive member being electrically isolated from the first bus bar and the second bus bar, and a second electrically conductive member joined to the third insulating member and fixed to the external structure, the third electrically conductive member being electrically isolated from the first bus bar and the second bus bar.

11. The resin-molded capacitor according to claim 10, wherein the first electrically conductive member includes a first region joined to the first insulating member and a second region joined to the second insulating member.

12. The resin-molded capacitor according to claim 10, wherein the first bus bar includes a first electrode terminal connected to the external electrical circuit, the second bus bar includes a second electrode terminal connected to the external electrical circuit, the first electrically conductive member includes a first fastening terminal fixed to the external structure, the second electrically conductive member includes a second fastening terminal fixed to the external structure, and the first electrode terminal, the second electrode terminal, the first fastening terminal, and the second fastening terminal are exposed to an exterior from the resin.

13. A power conversion device comprising a power conversion circuit that converts power between an alternating current electrical apparatus and a direct current power supply, wherein a smoothing capacitor is connected between direct current side terminals of the power conversion circuit, and the smoothing capacitor is configured of the resin-molded capacitor according to claim 10.

14. A resin-molded capacitor such that a capacitor main body is sealed with a resin, the capacitor main body including a capacitor element including a first capacitor electrode and a second capacitor electrode, a first bus bar joined to the first capacitor electrode and connected to an external electrical circuit, a second bus bar joined to the second capacitor electrode and connected to the external electrical circuit, a first insulating member joined to the first capacitor electrode or the first bus bar, a second insulating member joined to the second capacitor electrode or the second bus bar, a third insulating member joined to a winding face of the capacitor element, a first electrically conductive member joined to the first insulating member and the second insulating member and fixed to an external structure, and a second electrically conductive member joined to the third insulating member and fixed to the external structure, wherein the first insulating member and the second insulating member are configured of an insulating member having a permittivity higher than a permittivity of an insulating film acting as a component of the capacitor element, and the third insulating member is configured of an insulating member having a modulus of elasticity higher than a modulus of elasticity of the second electrically conductive member.

* * * * *